United States Patent [19]

Kim

[11] Patent Number: 5,702,965
[45] Date of Patent: Dec. 30, 1997

[54] FLASH MEMORY CELL AND METHOD OF MAKING THE SAME

[75] Inventor: Jeoung Woo Kim, Kyungki-Do, Rep. of Korea

[73] Assignee: Hyundai Electronics Industries Co., Ltd., Kyungki-Do, Rep. of Korea

[21] Appl. No.: 666,013

[22] Filed: Jun. 19, 1996

[30] Foreign Application Priority Data

Jun. 24, 1995 [KR] Rep. of Korea ............. 95-17272

[51] Int. Cl.⁶ ............. H01L 21/265; H01L 21/70; H01L 27/00; H01L 21/02
[52] U.S. Cl. ............. 47/43; 437/52; 437/241
[58] Field of Search ............. 437/40 GS, 41 GS, 437/43, 48, 49, 40 AS, 41 AS, 52, 241, 40 SW, 41 SW; 257/314, 315, 316, 317, 318, 319, 320, 321, 322, 323; 365/185.01, 185.1, 185.26

[56] References Cited

U.S. PATENT DOCUMENTS

| | | | |
|---|---|---|---|
| 4,981,813 | 1/1991 | Bryant et al. | 437/64 |
| 5,153,145 | 10/1992 | Lee et al. | 437/41 SW |
| 5,284,784 | 2/1994 | Mamley | 437/43 |
| 5,424,232 | 6/1995 | Yamauchi | 437/49 |
| 5,445,984 | 8/1995 | Hong et al. | 437/43 |
| 5,474,947 | 12/1995 | Chang et al. | 437/43 |
| 5,479,368 | 12/1995 | Keshtbod | 257/316 |
| 5,496,747 | 3/1996 | Hong | 437/43 |

*Primary Examiner*—Brian Dutton
*Attorney, Agent, or Firm*—Fish & Richardson P.C.

[57] ABSTRACT

A highly efficient split-gate type flash memory cell with an insulation spacer of an ONO or ON structure formed at the side walls of the floating gate according to the present invention can improve program and erasure capabilities of the cell by preventing reduction of the coupling ratio and leakage of electrons through the floating gate and the control gate.

12 Claims, 3 Drawing Sheets

(PRIOR ART) FIG. 1A
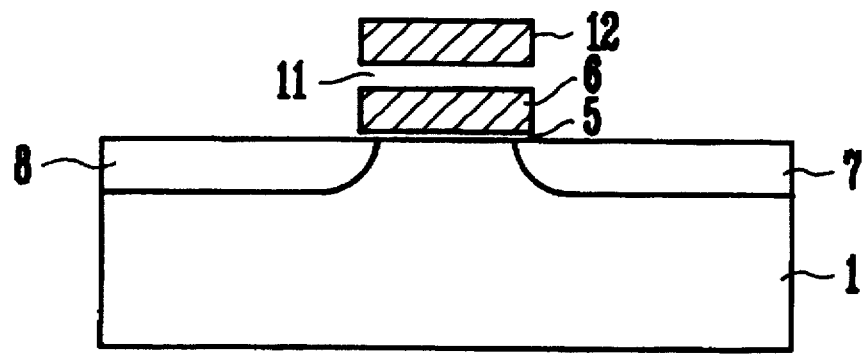
(PRIOR ART) FIG. 1B
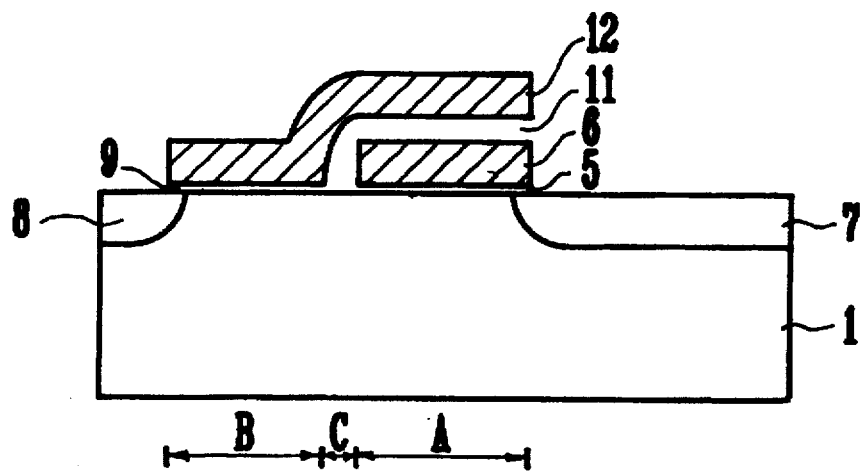
FIG. 2A
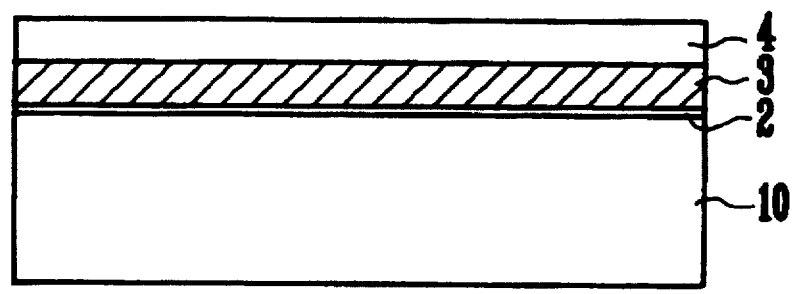

FLASH MEMORY CELL AND METHOD OF MAKING THE SAME

FIELD OF THE INVENTION

The present invention relates to a flash memory cell and method of making the same, more particularly to a flash memory cell and method of making the same which can prevent reduction of a coupling ratio by forming an insulating spacer of ONO (oxide-nitride-oxide) structure at the side walls of the floating gate.

BACKGROUND OF THE INVENTION

In general, non-volatile memory cells such as flash EEPROM (Electrically Erasable Programmable Read Only Memory) cell, EPROM, etc., which have both functions of electrical program and erasure can be classified into a stack-gate structure or a split-gate structure.

As shown in FIG. 1A, a flash memory cell having a conventional stack-gate structure is created by sequentially forming a tunnel oxide film 5, a floating gate 6, a dielectric film 11 and a control gate 12 on a silicon substrate 1, and thereafter, forming source and drain regions, 7 and 8, in the silicon substrate 1. As shown in FIG. 1B, a flash memory cell having a conventional split-gate structure is created by sequentially forming a tunnel oxide film 5, a floating gate 6, a dielectric film 11 and a control gate 12 on a silicon substrate 1, and thereafter, forming source and drain regions, 7 and 8, in the silicon substrate 1, wherein said control gate 12 being extended to the drain region 8, and a select gate oxide film 9 being formed between said extended control gate 12 and said drain region 8. Though the two memory cells are same in function in that they perform programming and erasure operations by injecting hot electrons into the floating gate or discharge them therefrom, the flash memory cell having the split-gate structure can effectively reduce the amount of current dissipating into the drain region 8 and thereby has a high efficiency of program and a low consumption of power since it uses a source side injection method by which hot electrons generating from the source region 7 are injected into the floating gate 6. As shown in FIG. 1B, the flash memory cell employing a source side injection method is divided into a stack-gate portion A and a select-gate portion B. A channel is formed between the stack-gate portion A and the select-gate portion B. The width of the channel C is determined by the thickness of the dielectric film 11 formed at the side walls of the floating gate 6. Therefore, the thickness of the dielectric film 11 greatly affects the program characteristics and the read current levels. In addition, the thickness of the dielectric film 11 formed at the side walls of the floating gate 6 must be less than 600 Å. Especially, in order to improve the read current level, the thickness of the dielectric film 11 must be thin so that the leakage of electrons between the floating gate 6 and the control gate 12 could be prevented completely. In a prior art, the dielectric film 11 is formed through the oxidation process after the floating gate 6 is formed. However, the dielectric film enlarges by a high rate of oxidation from a polysilicon into which phosphor (P) is doped, therefore, it is difficult to control the thickness thereof, resulting in low dielectric characteristics. Also, the width of the floating gate 6 is reduced as its side walls are oxidized, resulting in reduction of coupling ratio which adversely affects the program and a read characteristics.

SUMMARY OF THE INVENTION

Accordingly, the purpose of the present invention is to provide a flash memory cell and method of making the same which can overcome the above mentioned problem by forming an insulating spacer of ONO (oxide-nitride-oxide) structure at the side walls of the floating gate.

To achieve the above purpose, a flash memory cell according to the invention comprises: a floating gate and a tunnel oxide film which are formed at a selected region on a silicon substrate; an insulating film spacer formed at both sides of the floating gate; a dielectric film formed on the entire surface including the insulating film spacer; a source region formed in the silicon substrate, wherein the source region is extended to a portion of the silicon substrate under the tunnel oxide film; a drain region formed in the silicon substrate; and a control gate formed on the portion of the dielectric film which is located on the floating gate and is extended up to the portion of the dielectric film formed on the drain region.

A method of making a flash memory cell, comprises the steps of: sequentially forming a tunnel oxide film, a first polysilicon layer and an oxide film on a silicon substrate; patterning the oxide film and the first polysilicon layer to form a floating gate; forming source and drain regions in the silicon substrate; forming an insulating film on the entire surface of the silicon substrate after forming the source and drain regions; forming an insulating film spacer at the side walls of the the oxide film and floating gate film through an isotropic etching process; removing a portion of the oxide film remaining on the floating gate and performing a thermal oxidation process so as to form a select-gate oxide film on the exposed silicon substrate and a dielectric film on the floating gate; and forming a second polysilicon layer on the entire surface after performing the thermal oxidation process, and patterning the second polysilicon layer to form a control gate.

BRIEF DESCRIPTION OF THE DRAWINGS

For fuller understanding of the nature and objects of the invention, reference should be had to the following detailed description taken in conjunction with the accompanying drawings in which:

FIG. 1A shows a sectional view of a flash memory cell having a conventional stack-structure;

FIG. 1B shows a sectional view of a flash memory cell having a conventional split-gate structure; and FIG. 2A through FIG. 2G show sectional views for explaining a method of making a flash memory cell according to the present invention.

Similar reference characters refer to similar parts through the several views of the drawings.

DETAILED DESCRIPTION OF THE INVENTION

Figure 2B:
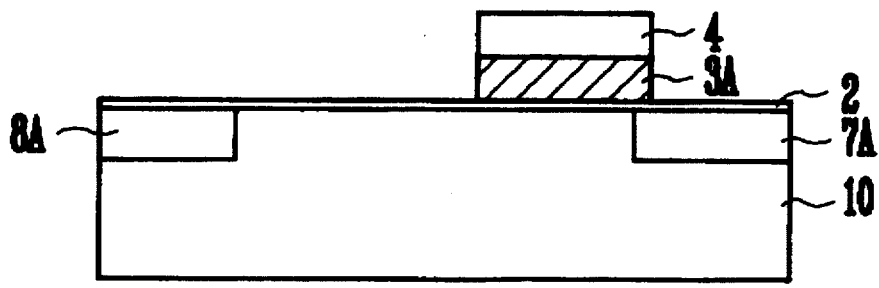

FIG. 2A through FIG. 2G show sectional views for explaining the method of making a flash memory cell according to the first embodiment of present invention.

FIG. 2A shows a sectional view in which a tunnel oxide film 2, a first polysilicon layer 3 and an oxide film 4 are sequentially formed on the entire surface of a silicon substrate 10, with the tunnel oxide film 2 being formed 50 through 100 Å in thickness, the oxide film 4 being formed 300 through 600 Å in thickness and phosphor (P) being doped into the polysilicon layer 3.

FIG. 2B shows a sectional view in which, after the oxide film 4 and the first polysilicon layer 3 are patterned to form a floating gate 3A through the photolithography and etching process using a mask for the floating gate electrode, source and drain regions, 7A and 8A, respectively, are formed in the silicon substrate 10 through the ion injection process using a given mask.

Figure 2C:
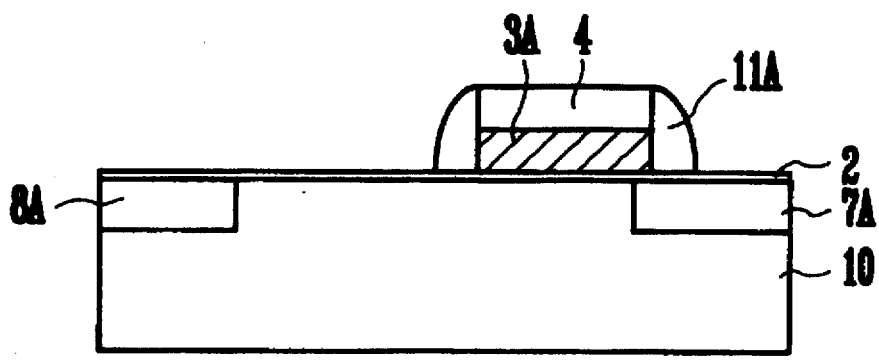

FIG. 2C shows a sectional view in which, after an insulating film is formed on the entire surface after forming the source and drain regions 7A and 8A an insulating spacer 11A is formed at the side walls of the patterned oxide film 4 and the floating gate 3A by performing an isotropic etching process until the silicon substrate 10 is exposed. The insulating film is formed in an ONO (Oxide-Nitride-Oxide) structure in which an underlying oxide film, a nitride film and an upper oxide film are sequentially stacked, or in an ON (Oxide-Nitride) structure, in which an oxide film and a nitride film are sequentially stacked, wherein the underlying oxide film is formed as a thermal oxide film or a CVD (Chemical Vapor Deposition) oxide film. The width of the insulating film spacer is 50 through 100 Å.

Figure 2D:
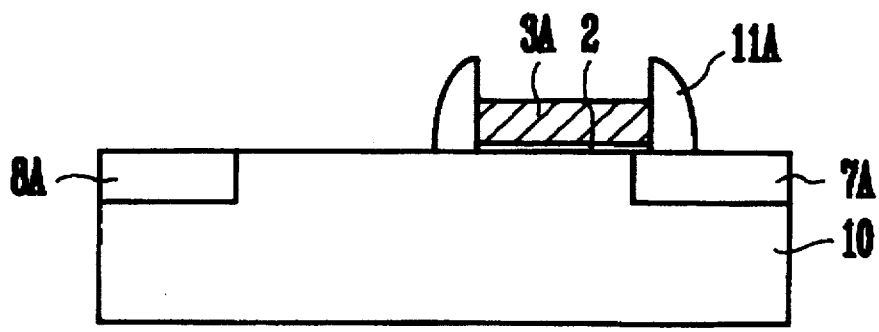

FIG. 2D shows a sectional view in which the oxide film 4 remaining on the floating gate 3A is removed by a wet etching process. However, when the oxide film 4 was not formed in FIG. 2A, the wet etching process is not required.

Figure 2E:
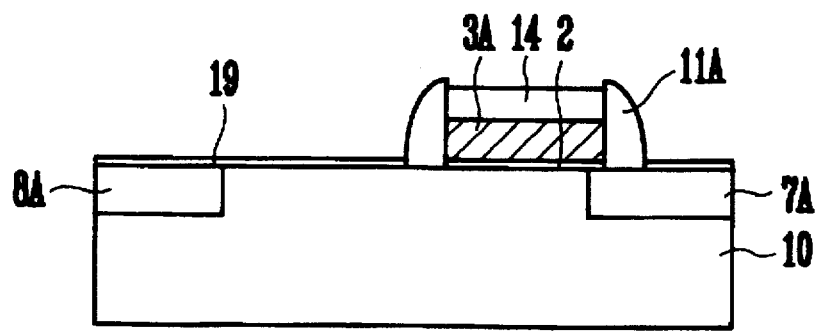

FIG. 2E shows a sectional view in which a thermal oxidation process is performed to form a select-gate oxide film 19 on the exposed silicon substrate 10 in FIG. 2D. The oxide film also formed on the floating gate 3A can be used as the dielectric film 14.

Figure 2F:
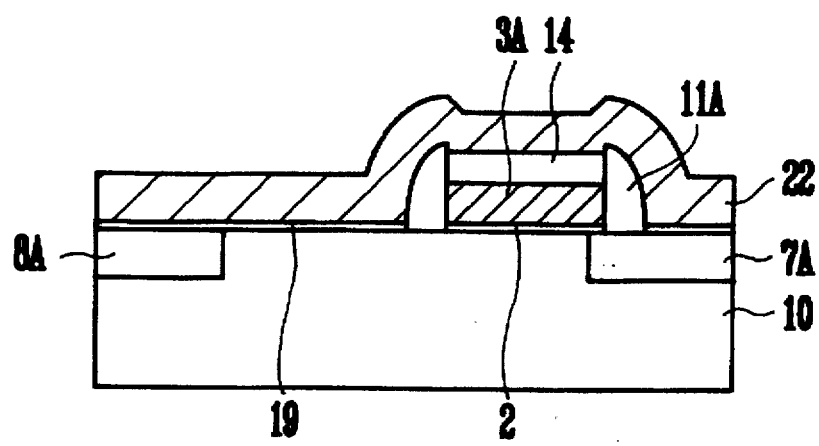
Figure 2G:
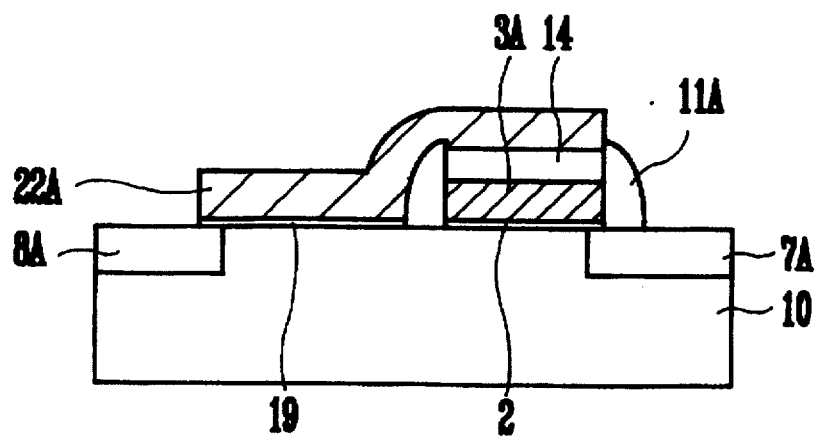

FIG. 2F shows a sectional view in which a second polysilicon layer 22 is formed on the entire upper surface. FIG. 2G shows a sectional view in which the second polysilicon layer 22 is patterned to form a control gate 22A through a photolithography and etching process using a mask for the control gate electrode. The flash memory cell formed according to the above process has good dielectric characteristics between the floating gate 3A and the control gate 22A and the thickness of the insulating film can easily be controlled since the insulating spacer 11A of ONO or ON structure is formed at the side walls of the floating gate 3A, thereby preventing reduction of coupling ratio as the side walls of the floating gate 3A are oxidized. A method of making a flash memory cell according to the second embodiment has aspects that are similar to the first embodiment described above. An important feature of the second embodiment is that the first polysilicon layer 3 is patterned to form the floating gate 3A without a step for forming the oxide film 4 on the first polysilicon layer 3 shown in FIG. 2A.

As mentioned above, the present invention has an outstanding effect which can prevent reduction of coupling ratio by forming the insulating spacer 11A of ONO or ON structure at the side walls of the floating gate 3A.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of making a flash memory cell in a semiconductor device, comprising:
    sequentially forming a tunnel oxide film, a first polysilicon layer and an oxide film on a silicon substrate;
    patterning said oxide film and said first polysilicon layer to form a floating gate on said substrate;
    forming source and drain regions in said silicon substrate;
    forming an insulating film on said tunnel oxide film, said first polysilicon layer and said oxide film after forming said source and drain regions, and forming an insulating film spacer at side walls of said oxide film and floating gate through an isotropic etching process, said insulating film having an ONO structure in which an underlying oxide film, a nitride film and an upper oxide film are sequentially stacked;
    removing a portion of said oxide film remaining on said floating gate and performing a thermal oxidation process so as to form a select-gate oxide film on the exposed silicon substrate and a dielectric film on said floating gate;
    forming a second polysilicon layer on said select-gate oxide film, said insulating film spacer and said dielectric film; and patterning said second polysilicon layer to form a control gate.

2. The method of claim 1, wherein said underlying oxide film is a CVD oxide film.

3. The method of claim 1, wherein said underlying oxide film is a thermal oxide film.

4. A method of making a flash memory cell in a semiconductor device, comprising:
    sequentially forming a tunnel oxide film and a first polysilicon layer on a silicon substrate;
    patterning said first polysilicon layer to form a floating gate;
    forming source and drain regions in said silicon substrate;
    forming an insulating film on said tunnel oxide film and said first polysilicon layer after forming said source and drain regions, and forming an insulating film spacer at side walls of said floating gate through an isotropic etching process, said insulating film having an ONO structure in which an underlying oxide film, a nitride film and an upper oxide film are sequentially stacked;
    performing a thermal oxidation process so as to form a select-gate oxide film on the exposed silicon substrate and a dielectric film on said floating gate;
    forming a second polysilicon layer on said select-gate oxide film, said insulating film spacer and said dielectric film; and patterning the second polysilicon layer to form a control gate.

5. The method of claim 4, wherein said underlying oxide film is a CVD oxide film.

6. The method of claim 4, wherein said underlying oxide film is a thermal oxide film.

7. A method of making a flash memory cell in a semiconductor device, comprising:
    sequentially forming a tunnel oxide film, a first polysilicon layer and an oxide film on a silicon substrate;
    patterning said oxide film and said first polysilicon layer to form a floating gate;
    forming source and drain regions in said silicon substrate;
    forming an insulating film on said tunnel oxide film, said first polysilicon layer and said oxide film after forming said source and drain regions, and forming an insulating film spacer at side walls of said oxide film and floating gate through an isotropic etching process, said insulating film having an ON structure in which an oxide film and a nitride film are sequentially stacked with respect to each other;
    removing a portion of said oxide film remaining on said floating gate and performing a thermal oxidation process so as to form a select-gate oxide film on the exposed silicon substrate and a dielectric film on said floating gate;

forming a second polysilicon layer on said select-gate oxide film, said insulating film spacer and said dielectric film; and patterning said second polysilicon layer to form a control gate.

8. The method of claim 7, wherein said oxide film is a CVD oxide film.

9. The method of claim 7, wherein said oxide film is a thermal oxide film.

10. A method of making a flash memory cell in a semiconductor device, comprising:

sequentially forming a tunnel oxide film and a first polysilicon layer on a silicon substrate;

patterning said first polysilicon layer to form a floating gate;

forming source and drain regions in said silicon substrate;

forming an insulating film on the said tunnel oxide film and said first polysilicon layer after forming said source and drain regions, and forming an insulating film spacer at side walls of said floating gate through an isotropic etching process, said insulating film having an ON structure in which an oxide film and a nitride film are sequentially stacked with respect to each other;

removing a portion of said oxide film remaining on said floating gate and performing a thermal oxidation process so as to form a select-gate oxide film on the exposed silicon substrate and a dielectric film on said floating gate;

forming a second polysilicon layer on said select-gate oxide film, and said insulating film spacer and said dielectric film; and pattering said second polysilicon layer to form a control gate.

11. The method of claim 10, wherein said oxide film is a CVD oxide film.

12. The method of claim 10, wherein said oxide film is a thermal oxide film.

* * * * *